(12) United States Patent
Nakata et al.

(10) Patent No.: US 9,935,621 B2
(45) Date of Patent: Apr. 3, 2018

(54) SEMICONDUCTOR DEVICE

(71) Applicant: Toshiba Memory Corporation, Minato-ku (JP)

(72) Inventors: Masashi Nakata, Yokohama (JP); Hidefumi Kushibe, Kamakura (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/062,491

(22) Filed: Mar. 7, 2016

(65) Prior Publication Data

US 2017/0077915 A1    Mar. 16, 2017

Related U.S. Application Data

(60) Provisional application No. 62/216,886, filed on Sep. 10, 2015.

(51) Int. Cl.
| | | |
|---|---|---|
| *H03K 3/017* | (2006.01) | |
| *H03K 5/04* | (2006.01) | |
| *H03K 7/08* | (2006.01) | |
| *H03K 5/156* | (2006.01) | |

(52) U.S. Cl.
 CPC ................................ *H03K 5/1565* (2013.01)

(58) Field of Classification Search
 CPC ............ H03K 5/01; H03K 5/04; H03K 3/017; H03K 5/1565; H03K 7/08
 USPC .................................................. 327/172, 175
 See application file for complete search history.

(56) References Cited

U.S. PATENT DOCUMENTS

| | | | |
|---|---|---|---|
| 6,958,639 B2 | 10/2005 | Park et al. | |
| 7,411,435 B2 | 8/2008 | Monma et al. | |
| 7,417,479 B2 | 8/2008 | Kitayama | |
| 7,567,103 B2 * | 7/2009 | Park ...................... | H03L 7/0812 327/149 |
| 7,642,829 B2 | 1/2010 | Monma et al. | |
| 7,800,423 B2 | 9/2010 | Kim et al. | |
| 7,863,957 B2 | 1/2011 | Jang et al. | |
| 7,932,759 B2 | 4/2011 | Abe et al. | |

(Continued)

FOREIGN PATENT DOCUMENTS

| | | |
|---|---|---|
| JP | 2009-284484 | 12/2009 |
| JP | 4428246 | 3/2010 |

(Continued)

*Primary Examiner* — Lincoln Donovan
*Assistant Examiner* — Diana J Cheng
(74) *Attorney, Agent, or Firm* — Oblon, McClelland, Maier & Neustadt, L.L.P.

(57) ABSTRACT

According to one embodiment, there is provided a semiconductor device including an input terminal, an output terminal, an oscillation circuit, an adjuster circuit, a driver circuit, and a detector circuit. The input terminal receives a first clock. The oscillation circuit generates an internal clock. The adjuster circuit corrects a duty ratio of a clock. The driver circuit receives the clock from the adjuster circuit and supplies a third clock to the output terminal. The detector circuit detects that a duty ratio of a clock according to the third clock deviates from a duty ratio of a second clock according to the internal clock. The adjuster circuit adjusts a correction amount in tune with the second clock, and corrects a duty ratio of the first clock with the adjusted correction amount according to a detection result of the detector circuit.

20 Claims, 14 Drawing Sheets

(56) References Cited

U.S. PATENT DOCUMENTS 8,164,371 B2    4/2012   Monma
8,362,815 B2 *  1/2013   Pavlovic ................. H03L 7/081
                                                          327/156
8,732,512 B2    5/2014   Miyano

FOREIGN PATENT DOCUMENTS

| JP | 2010-88108 | 4/2010 |
| JP | 2010-226173 | 10/2010 |
| JP | 2011-77426 | 4/2011 |

* cited by examiner

SEMICONDUCTOR DEVICE

CROSS-REFERENCE TO RELATED APPLICATIONS

This application is based upon and claims the benefit of priority from U.S. Provisional Application No. 62/216,886, filed on Sep. 10, 2015 the entire content of which are incorporated herein by reference.

FIELD

Embodiments described herein relate generally to a semiconductor device.

BACKGROUND

Semiconductor devices can receive a clock from an outside and output a clock according to the received clock to an outside. At this time, a duty ratio of the clocks is desirably adjusted to an appropriate value.

DETAILED DESCRIPTION

In general, according to one embodiment, there is provided a semiconductor device including an input terminal, an output terminal, an oscillation circuit, an adjuster circuit, a driver circuit, and a detector circuit. The input terminal receives a first clock. The oscillation circuit generates an internal clock. The adjuster circuit corrects a duty ratio of a clock. The driver circuit receives the clock from the adjuster circuit and supplies a third clock to the output terminal. The detector circuit detects that a duty ratio of a clock according to the third clock deviates from a duty ratio of a second clock according to the internal clock. The adjuster circuit adjusts a correction amount in tune with the second clock, and corrects a duty ratio of the first clock with the adjusted correction amount according to a detection result of the detector circuit.

Exemplary embodiments of a semiconductor device will be explained below in detail with reference to the accompanying drawings. The present invention is not limited to the following embodiments.

EMBODIMENT

Figure 1:
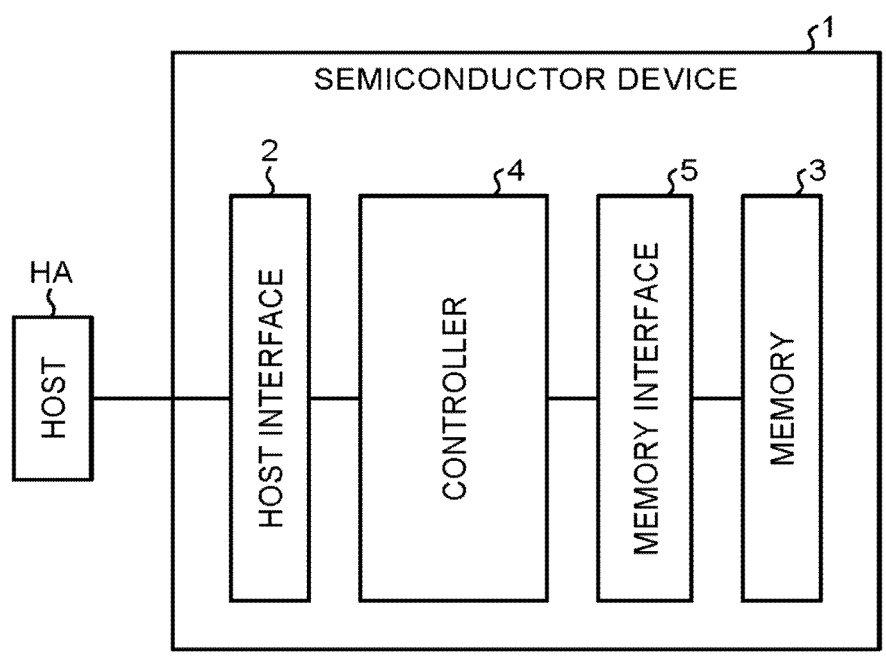
FIG. 1 is a diagram illustrating a configuration of a semiconductor device according to an embodiment.

A semiconductor device 1 according to an embodiment will be described using FIG. 1. FIG. 1 is a diagram illustrating a configuration of the semiconductor device 1.

The semiconductor device 1 includes, as illustrated in FIG. 1, a memory 3, a controller 4, a memory interface 5, and a host interface 2. The semiconductor device 1 is connected to a host HA, and functions as an external storage device of the host HA, for example. The semiconductor device 1 is a memory device for built-in use in conformity to the embedded multimedia card (eMMC) standard, for example. The host HA is a personal computer, a mobile phone, an imaging device, or the like.

The memory 3 may be non-volatile memory such as NAND-type flash memory, or volatile memory such as synchronous dynamic random access memory (SDRAM).

The host interface 2 can be connected with the host HA through a communication line (a serial communication line, for example), and transmits/receives information to/from the host HA and transmits information to the semiconductor device 1.

For example, when having received a write request from the host HA, the host interface 2 supplies the write request to the memory interface 5 through the controller 4. The memory interface 5 performs write processing of writing data in the memory 3 according to the write request. When the write processing is completed, the memory interface 5 supplies a completion notification to the host interface 2 through the controller 4. The host interface 2 transmits the completion notification to the host HA.

Further, when having received a read request from the host HA, the host interface 2 supplies the read request to the memory interface 5 through the controller 4. The memory interface 5 performs read processing of reading data from the memory 3 according to the read request. The memory interface 5 supplies the read data to the host interface 2 through the controller 4. The host interface transmits the read data to the host HA.

Here, the host interface 2 receives a host clock φHSTCK from the host HA. The host interface 2 generates an output clock (data strobe signal) φOUTCK according to the host clock φHSTCK, and transmits the read data to the host HA as a data synchronized with the output clock φOUTCK. The output clock φOUTCK may have a waveform distorted in the process of being transmitted in the host interface 2. Therefore, variation of a duty ratio of the output clock φOUTCK may become large. In this case, to appropriately transmit the read data to the host HA, it is necessary to set the duty ratio of the output clock φOUTCK to an appropriate value (for example, an optimum duty ratio of 50%). This can be realized by adjusting a duty ratio of the received host clock φHSTCK to generate the output clock φOUTCK. For example, in the eMMC I/F standard, an upper limit specification of a variation value of the duty ratio of clocks is defined. Therefore, to comply with the standard, an adjustment amount of the duty ratio of the host clock φHSTCK needs to be precise and appropriate. Further, when a training period is not provided after startup of the semiconductor device 1, the semiconductor device 1 needs to have the duty ratio of the output clock φOUTCK satisfy the specification from the first clock of the host clock φHSTCK.

Therefore, in the present embodiment, the host interface 2 adjusts a correction amount of the duty ratio, using a calibration clock φCALCK generated inside the host interface 2, and corrects the duty ratio of the host clock φHSTCK received from the host HA, with the adjusted correction amount. Accordingly, when the semiconductor device 1 is started-up, it is possible to make the duty ratio of the output clock φOUTCK satisfy the specification from the first clock of the host clock φHSTCK.

Figure 2:
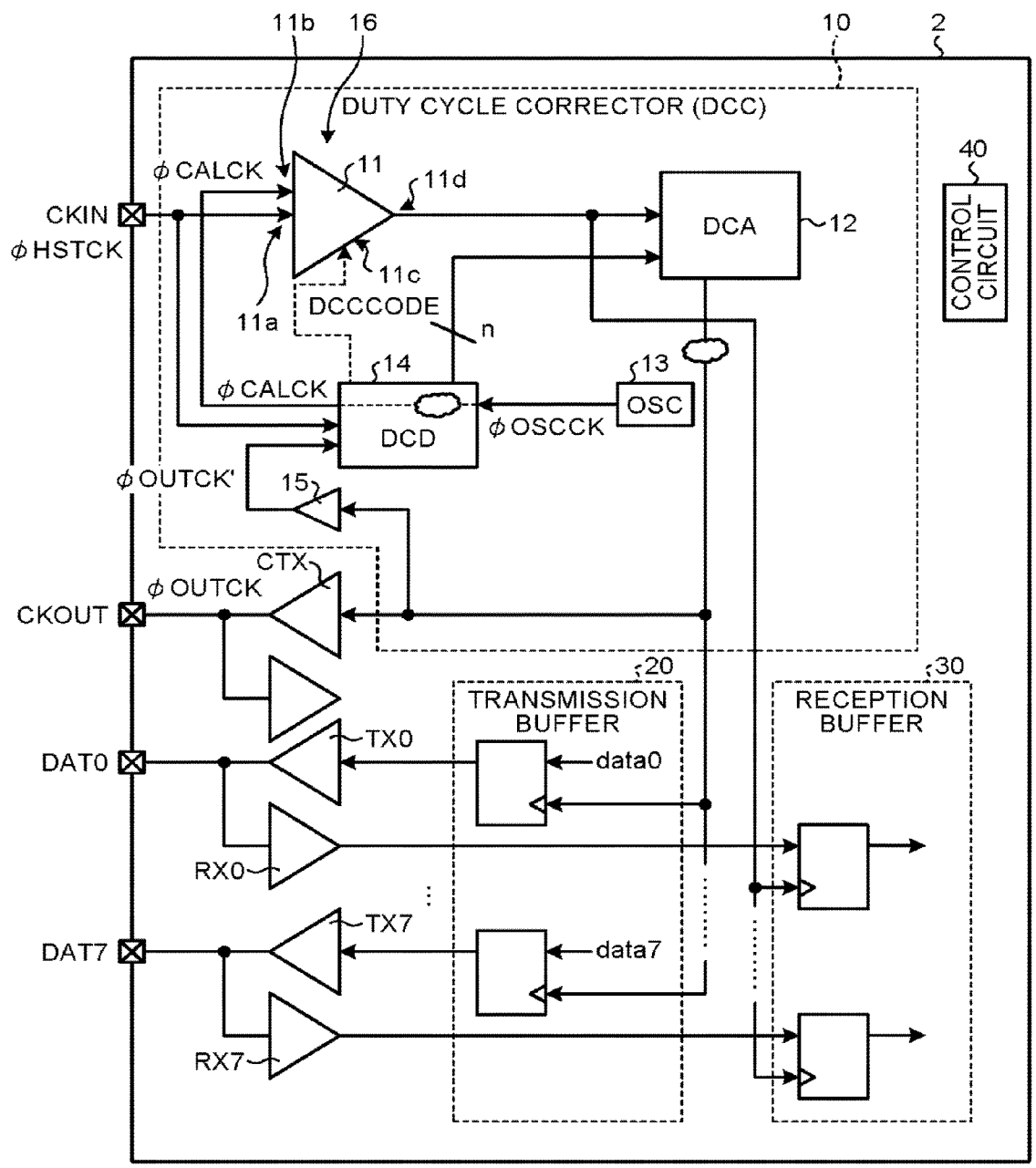
FIG. 2 is a diagram illustrating a configuration of a host interface in an embodiment.

To be specific, as illustrated in FIG. 2, the host interface 2 includes an input terminal CKIN, an output terminal CKOUT, input/output terminals DAT0 to DAT7, a duty cycle corrector 10, a transmission buffer 20, a reception buffer 30, driver circuits CTX, and TX0 to TX7, receivers RX0 to RX7, and a control circuit 40.

The input terminal CKIN is an input terminal that can be connected with the host HA through the communication line, and receives the host clock φHSTCK from the host HA.

The output terminal CKOUT is an output terminal that can be connected with the host HA through the communication line, and transmits the output clock φOUTCK to the host HA.

The input/output terminals DAT0 to DAT7 are input/output terminals that can be connected with the host HA through the communication line, and transmit/receive data to/from the host HA.

The duty cycle corrector (DCC) 10 includes a built-in oscillation circuit (OSC) 13, a duty cycle detector circuit (DCD) 14, a selection circuit 16, a duty cycle adjuster circuit (DCA) 12, and a replica circuit 15.

The OSC 13 includes an oscillator that oscillates in response to power supply from the semiconductor device 1, and generates an internal clock φOSCCK, using the oscillator. The OSC 13 supplies the generated internal clock φOSCCK to the DCD 14.

The replica circuit 15 has a characteristic equivalent to the driver circuit CTX. The driver circuit CTX generates the output clock φOUTCK in response to the clock output from the DCA 12, and supplies the output clock φOUTCK to the output terminal CKOUT. Similarly, the replica circuit 15 generates a replica clock φOUTCK' in response to the clock output from the DCA 12, and supplies the replica clock φOUTCK' to the DCD 14. The replica clock φOUTCK' is a replica clock of the output clock φOUTCK.

The DCD 14 generates the calibration clock φCALCK according to the internal clock φOSCCK. For example, when the internal clock φOSCCK has a frequency of m times (m is an integer of 2 or more) the host clock φHSTCK, the DCD 14 frequency-divides the internal clock φOSCCK by m to generate the calibration clock φCALCK. The DCD 14 supplies the generated calibration clock φCALCK to the selection circuit 16.

Further, the DCD 14 detects that the duty ratio of the replica clock φOUTCK' deviates from the duty ratio of the calibration clock φCALCK. The DCD 14 includes a detection result in a control code DCCCODE and supplies the control code DCCCODE to the DCA 12. The control code DCCCODE is n-bit data, and includes a value of the duty ratio to be adjusted in the DCA 12, for example. The control code DCCCODE is incremented or decremented according to a detection result cmpout of whether the duty ratio of the replica clock φOUTCK' clock is higher than the duty ratio (for example, 50%) of the calibration clock φCALCK.

The selection circuit 16 is connected between the input terminal CKIN and the DCD 14, and the DCA 12. The selection circuit 16 receives the host clock φHSTCK from the input terminal CKIN, and receives the calibration clock φCALCK from the DCD 14. The selection circuit 16 selects either the host clock φHSTCK or the calibration clock φCALCK, and supplies the selected clock to the DCA 12.

The selection circuit 16 includes a receiver 11. The receiver 11 includes an input node 11a, an input node 11b, a control node ho, and an output node 11d. The input node 11a is connected to the input terminal CKIN, and is input the host clock φHSTCK from the input terminal CKIN. The input node 11b is connected to the DCD 14, and is input the calibration clock φCALCK from the DCD 14. The control node 11c is connected to the control circuit 40, and is supplied a selection signal (for example, a selection signal SELECT1 or SELECT2 illustrated in FIG. 6) from the control circuit 40.

The receiver 11 selects either the host clock φHSTCK or the calibration clock φCALCK according to the selection signal, and supplies the selected clock to the DCA 12. For example, when a selection signal SELCAL is in an active level and a selection signal SELHST is in a non-active level, the receiver 11 selects the calibration clock φCALCK, and supplies the calibration clock φCALCK to the DCA 12. When the selection signal SELCAL is in a non-active level and the selection signal SELHST is in an active level, the receiver 11 selects the host clock φHSTCK and supplies the host clock φHSTCK to the DCA 12.

The DCA 12 corrects the host clock φHSTCK in tune with the calibration clock φCALCK. For example, the DCA 12 has an input side connected to the selection circuit 16 and the DCD 14, and has an output side connected to the replica circuit 15, the driver circuit CTX, the transmission buffer 20, and the reception buffer 30. The DCA 12 receives a clock of the host clock φHSTCK and the calibration clock φCALCK, the clock having been selected in the selection circuit 16, and receives the control code DCCCODE from the DCD 14. The DCA 12 corrects the duty ratio of clock according to the control code DCCCODE. The DCA 12 has a correction amount of K tone (K is an integer of 2 or more, for example, K=64), and can adjust the duty ratio of the clock in K stages (K is an integer of 2 or more, for example, K=64). The control code DCCCODE includes a value of the tone to be adjusted in the DCA 12, for example. The DCA 12 performs correction of delaying rising timing of a waveform with a delay amount (correction amount) of the K tone without changing falling timing of the waveform (see FIG. 10). At this time, the DCA 12 can adjust the duty ratio with the correction amount of the first tone to a maximum value, and can adjust the duty ratio with the correction amount of the K-th tone to a minimum value.

For example, the DCD 14 detects whether the duty ratio of the replica clock φOUTCK' is higher than the duty ratio of the calibration clock φCALCK for each edge timing of the internal clock φOSCCK, and updates the control code DCCCODE according to the detection result cmpout.

When the detection result cmpout is "L", the DCA 12 increments the tone of the correction amount of the duty ratio from a current value (for example, K/2 tone) for each edge timing of the internal clock φOSCCK. Then, when the detection result cmpout becomes "H", the DCA 12 stops the increment of the tone of the correction amount of the duty ratio. Accordingly, the correction amount of the DCA 12 can be adjusted to an amount with which the duty ratio of the replica clock φOUTCK' (≈the duty ratio of the output clock φOUTCK) becomes a value close to a reference value (for example, 50%).

Alternatively, when the detection result cmpout is "H", the DCA 12 decrements the tone of the correction amount of the duty ratio from the current value (for example, K/2 tone) of the tone of the correction amount for each edge timing of the internal clock φOSCCK. Then, when the detection result cmpout becomes "L", the DCA 12 stops the decrement of the tone of the correction amount of the duty ratio. Accordingly, the correction amount of the DCA 12 can be adjusted to an amount with which the duty ratio of the replica clock φOUTCK' (≈the duty ratio of the output clock φOUTCK) becomes a value close to a reference value value (for example, 50%).

Figure 3:
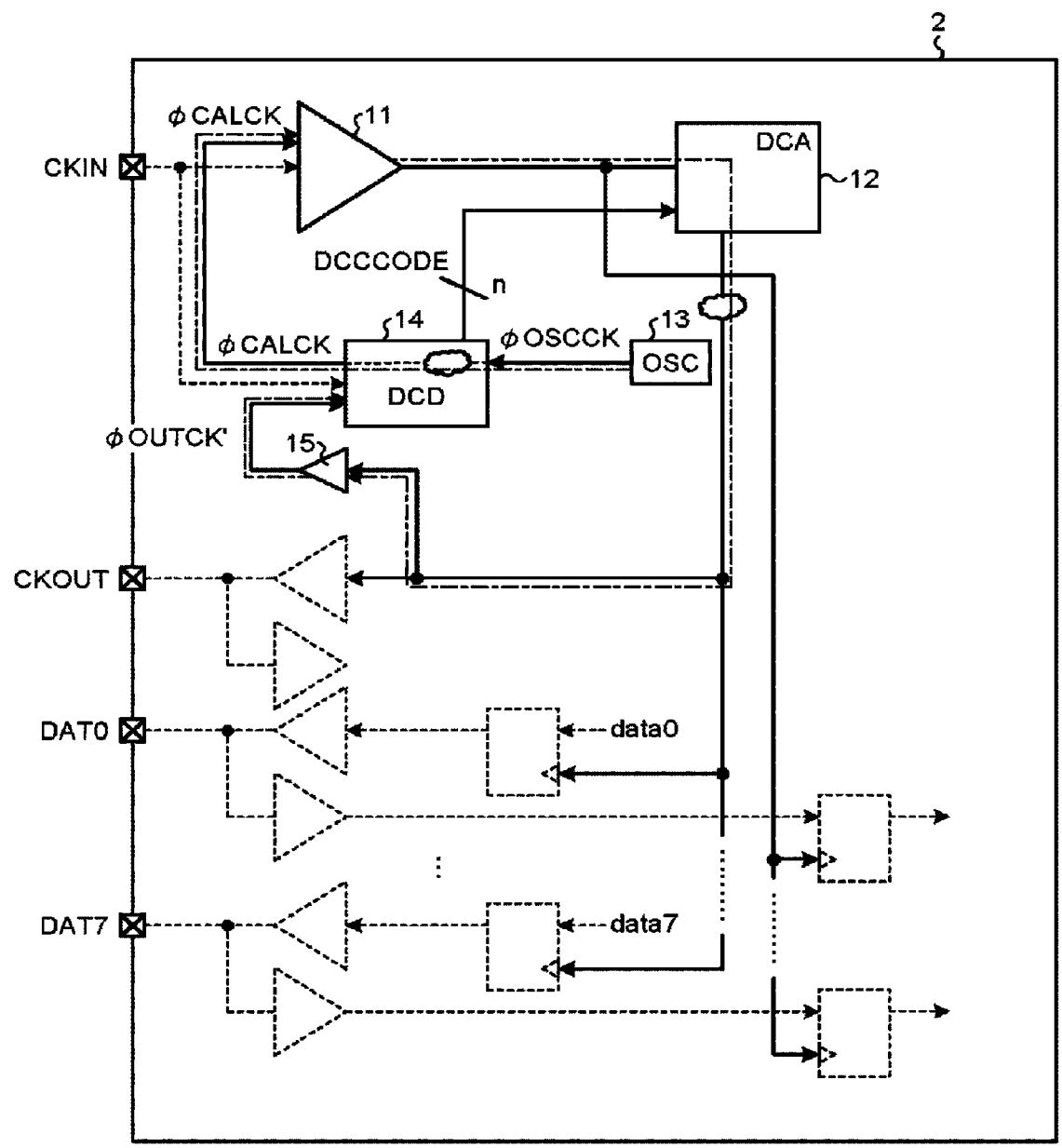
FIG. 3 is a diagram illustrating an operation of a host interface in an embodiment.

For example, the duty cycle corrector 10 generates the internal clock φOSCCK in the OSC 13, and generates the calibration clock φCALCK in the DCD 14 according to the internal clock φOSCCK, in a first period, as illustrated in FIG. 3 by the dot and dash line. The generated calibration clock φCALCK is supplied to the DCA 12 through the receiver 11, and is corrected with the current correction amount by the DCA 12. The corrected clock output front the DCA 12 is supplied to the replica circuit 15, and the replica clock φOUTCK' is generated in the replica circuit 15, and is supplied to the DCD 14. The DCD 14 detects whether the duty ratio of the replica clock φOUTCK' deviates from the duty ratio of the calibration clock φCALCK, and supplies the control code DCCCODE including a detection result flag to the DCA 12. The DCA 12 adjusts the correction amount according to the detection result flag included in the control code DCCCODE until the correction amount is determined to be appropriate. That is, in the first period, adjustment of the correction amount of the duty ratio is performed using the calibration clock φCALCK. The first period is a period at the time of startup of the semiconductor device 1, and includes a period from timing when the semiconductor device 1 is started to timing when the host clock φHSTCK is supplied to the input terminal CKIN. FIG. 3 is a diagram illustrating an operation of the host interface 2 in the first period.

Figure 4:
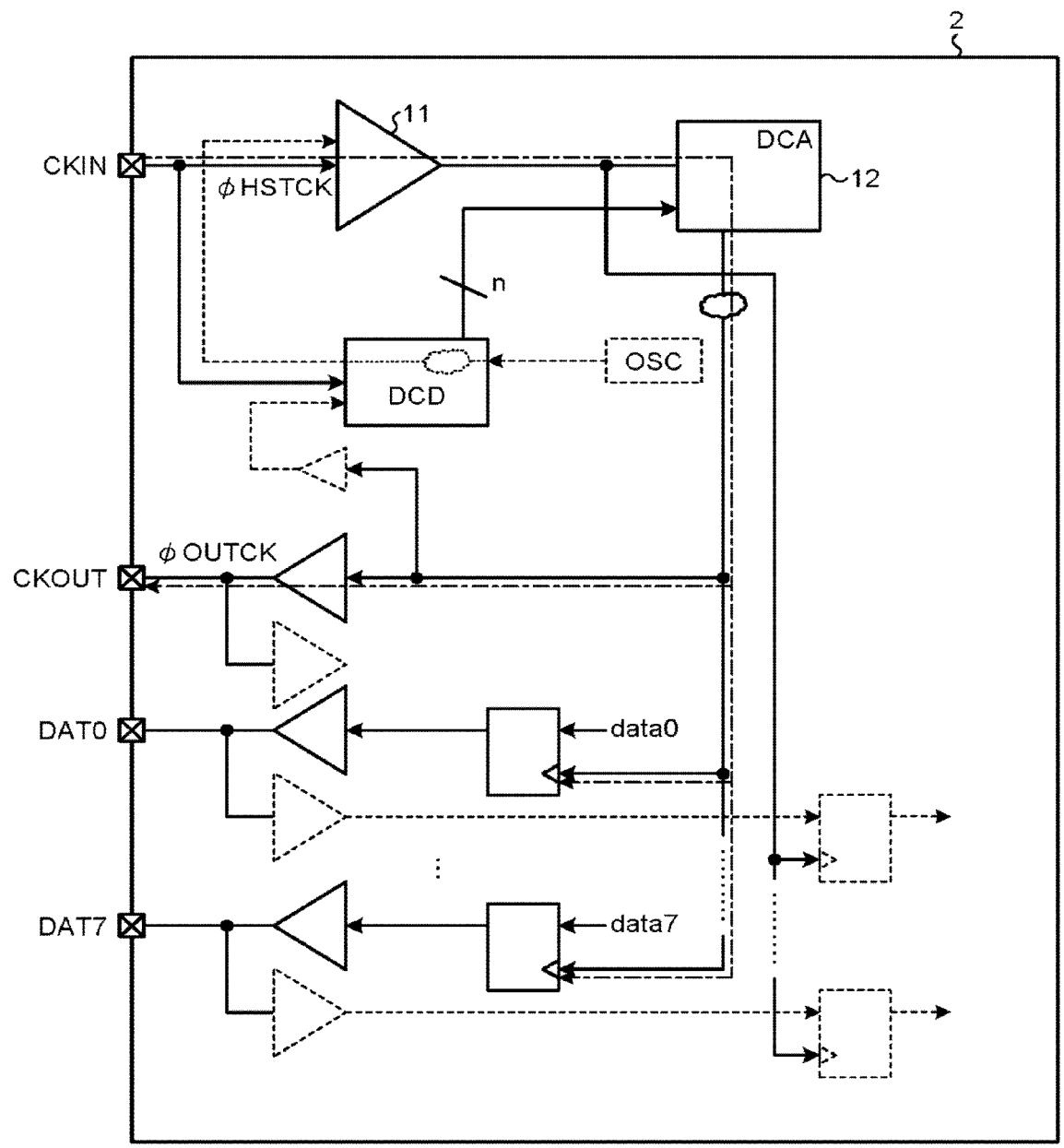
FIG. 4 is a diagram illustrating an operation of a host interface in an embodiment.
Figure 5:
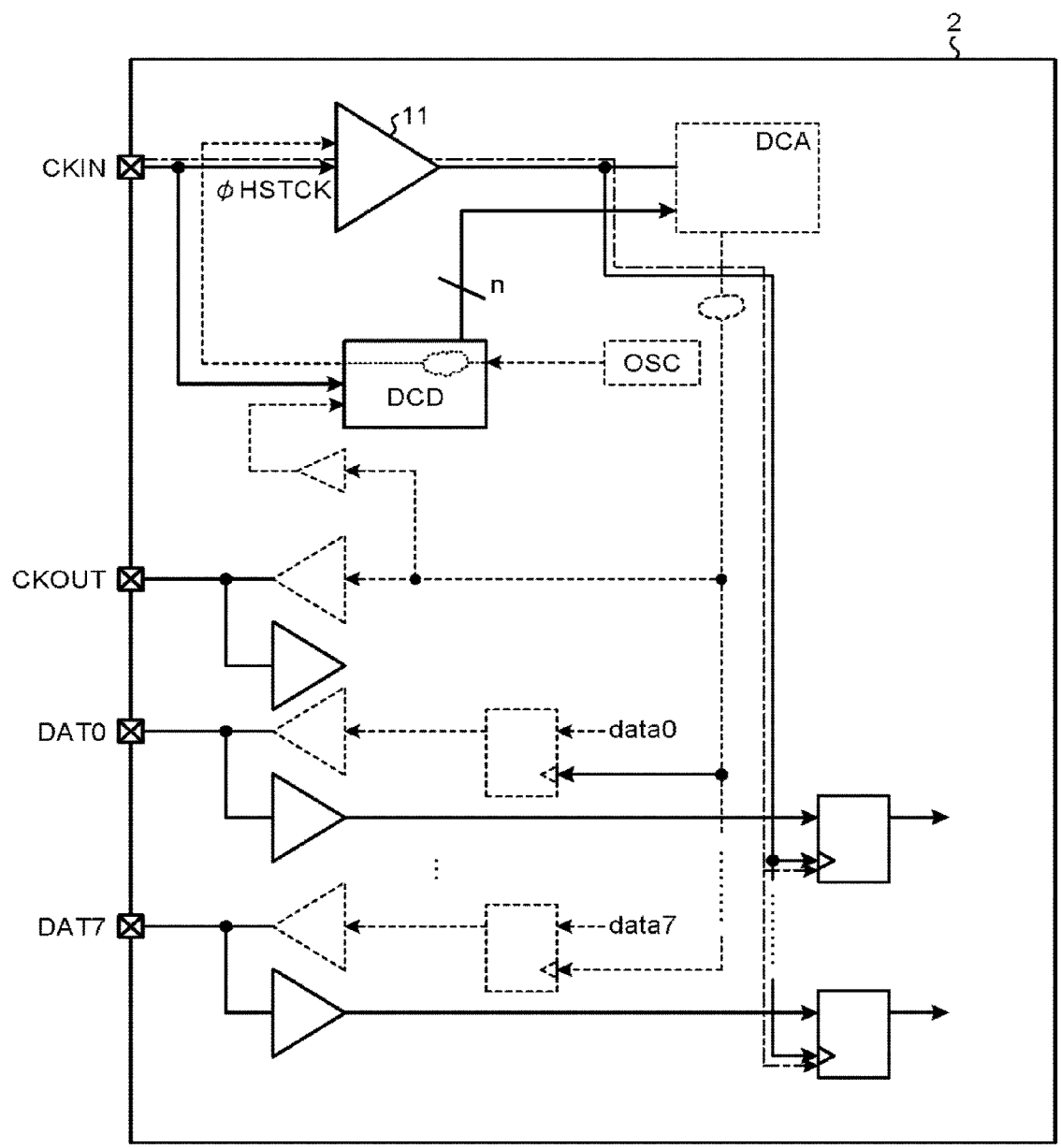
FIG. 5 is a diagram illustrating an operation of a host interface in an embodiment.

The duty cycle corrector 10 corrects the duty ratio of the host clock φHSTCK from the host HA with the above-described adjusted correction amount in a second period, as illustrated in FIGS. 4 and 5 by the dot and dash line. The first period is a period in which a stable operation after the startup of the semiconductor device 1 is performed, and is, for example, a period before timing when the host clock φHSTCK is supplied to the input terminal CKTN. FIG. 4 is a diagram illustrating an operation of the host interface 2 in the second period, and is a diagram illustrating an operation according to the read request from the host HA. FIG. 5 is a diagram illustrating an operation of the host interface 2 in the second period, and is a diagram illustrating an operation according to the write request from the host HA.

Accordingly, the correction amount of the duty correction can be adjusted without having an influence on the host HA in the first period. As a result, the duty ratio of the output clock φOUTCK can satisfy the specification from the first clock (from the beginning of the second period) of the host clock φHSTCK.

Note that it is possible to continuously move the DCD 14 in the second period. By dynamically adjusting the correction amount of the DCA 12 such that the duty ratio of the replica clock φOUTCK' comes to the reference, based on the host clock φHSTCK, deviation due to temperature/voltage variation during an operation can be further corrected.

Alternatively, the correction amount of the DCA 12 may be dynamically adjusted even in the second period such that the duty ratio of the replica clock φOUTCK' comes to the reference, based on the calibration clock φCALCK. Accordingly, deviation of the duty ratio of the host clock φHSTCK from an appropriate value (for example, 50%) can also be corrected. Note that, in this case, it is desirable to accurately adjust the duty ratio of the calibration clock φCALCK to 50%. In the present embodiment, to adjust the duty ratio of the calibration clock φCALCK to 50%, a frequency of the internal clock φOSCCK is caused to be m times (for example, twice) the frequency of the host clock φHSTCK, and the internal clock φOSCCK is divided by m (for example, is halved) to generate the calibration clock φCALCK in the DCD 14.

Figure 6:
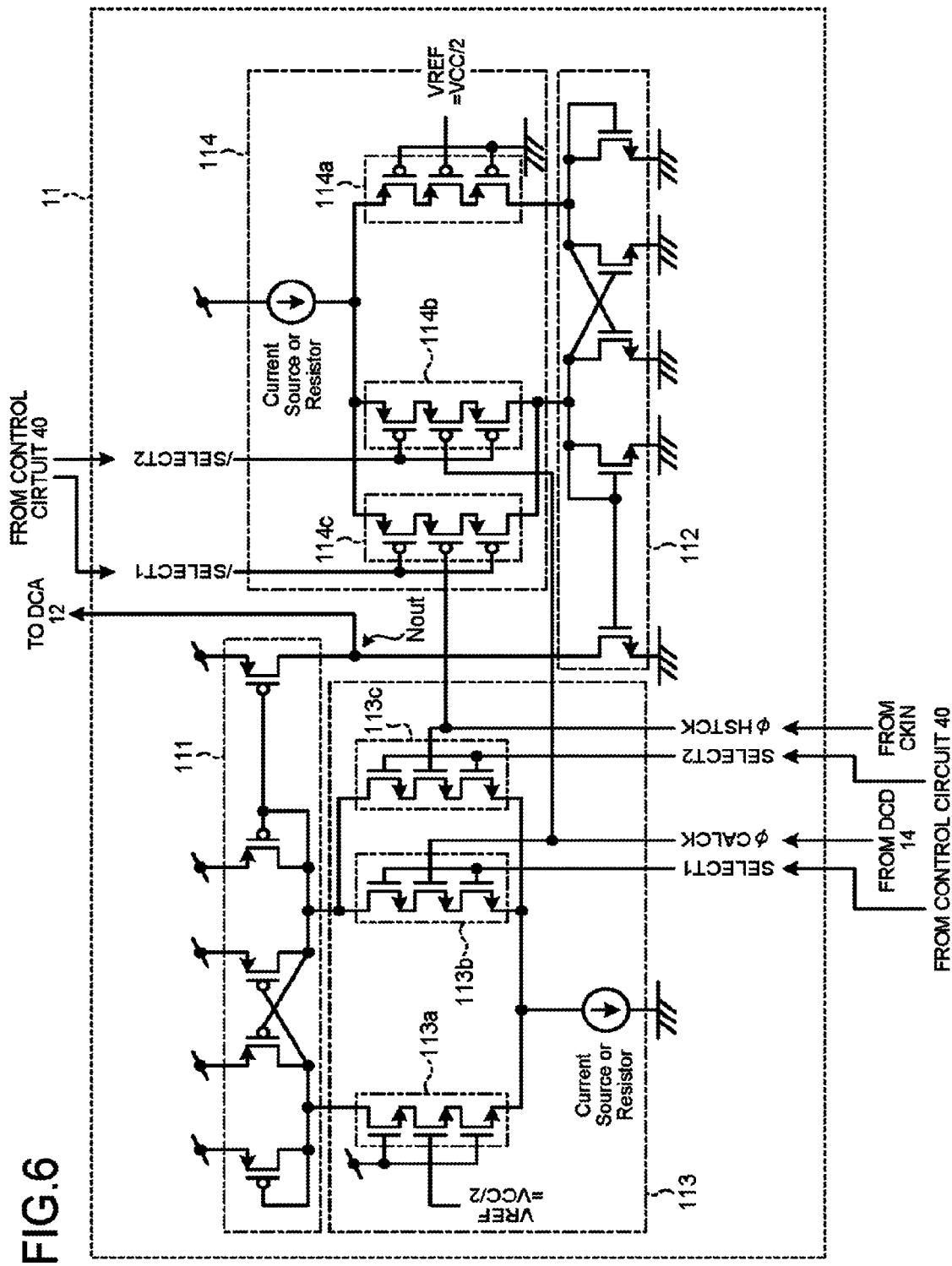
FIG. 6 is a diagram illustrating a configuration of a receiver in an embodiment.

Next, a configuration of the receiver 11 will be described using FIG. 6. FIG. 6 is a diagram illustrating a configuration of the receiver 11.

The receiver 11 includes differential stages 113 and 114 and gain stages 111 and 112. In the differential stages 113 and 114, a differential current flows, which is of between the transistor groups 113a and 114a to which a reference voltage VREF is supplied, and transistor groups that have been activated according to the selection signals SELECT1 and SELECT2, of the transistor groups 113b, 113c, 114b, and 114c. In each of the transistor groups 113a to 113c, and 114a to 114c, transistors are connected in series between the gain stages 111 and 112, and a current source, to share a source and a drain. The gain stages 111 and 112 include a current mirror circuit, and amplify the differential current according to a mirror ratio and cause the differential current to flow to an output node Pout.

Accordingly, when the selection signal SELECT1 is in an active level and the selection signal SELECT2 is in a non-active level, the calibration clock φCALCK is selected and supplied to the DCA 12. When the selection signal SELECT1 is in a non-active level and the selection signal SELECT2 is in an active level, the host clock φHSTCK is selected and supplied to the DCA 12.

Figure 7:
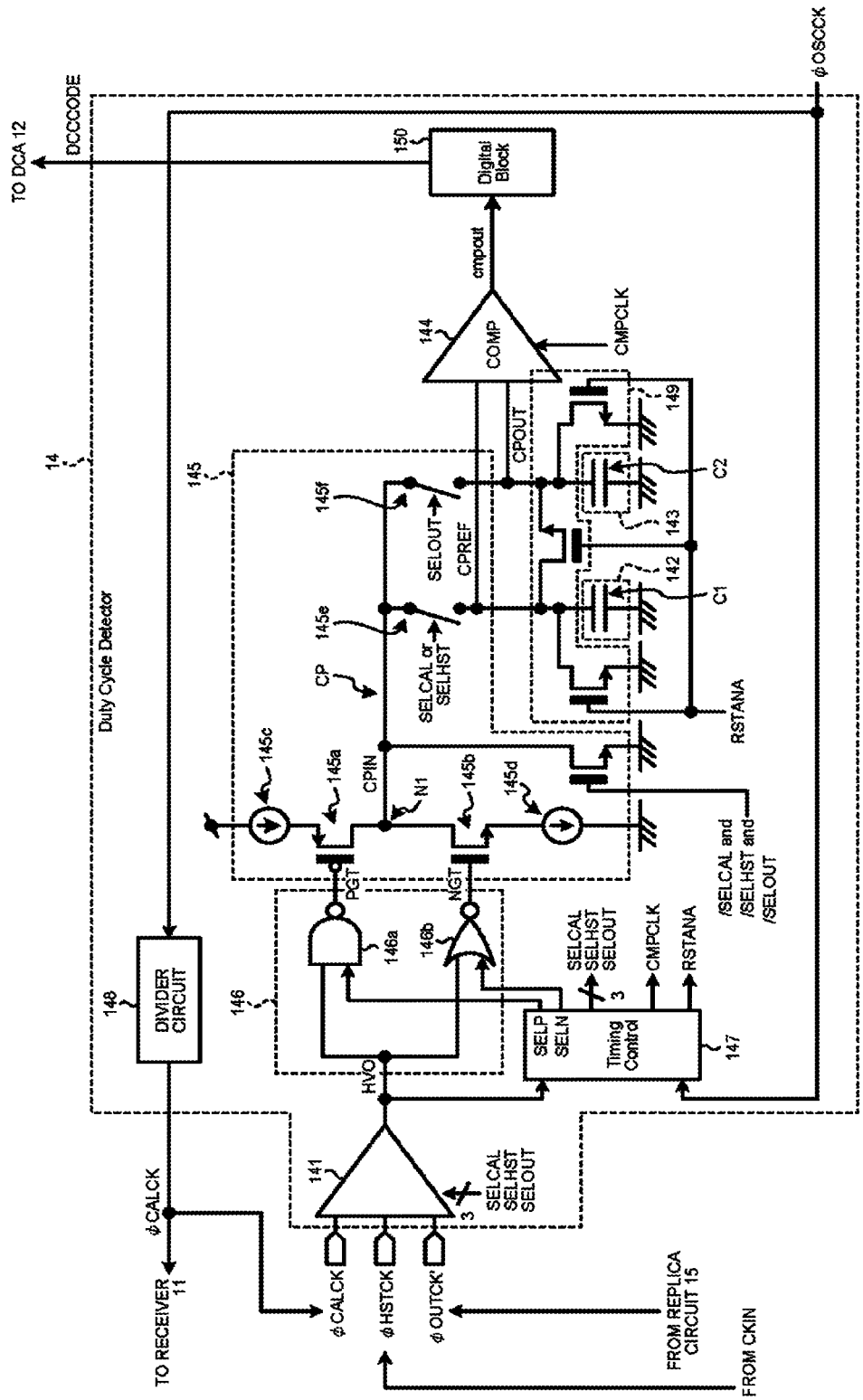
FIG. 7 is a diagram illustrating a configuration of a duty cycle detector circuit (DCD) in an embodiment.
Figure 8:
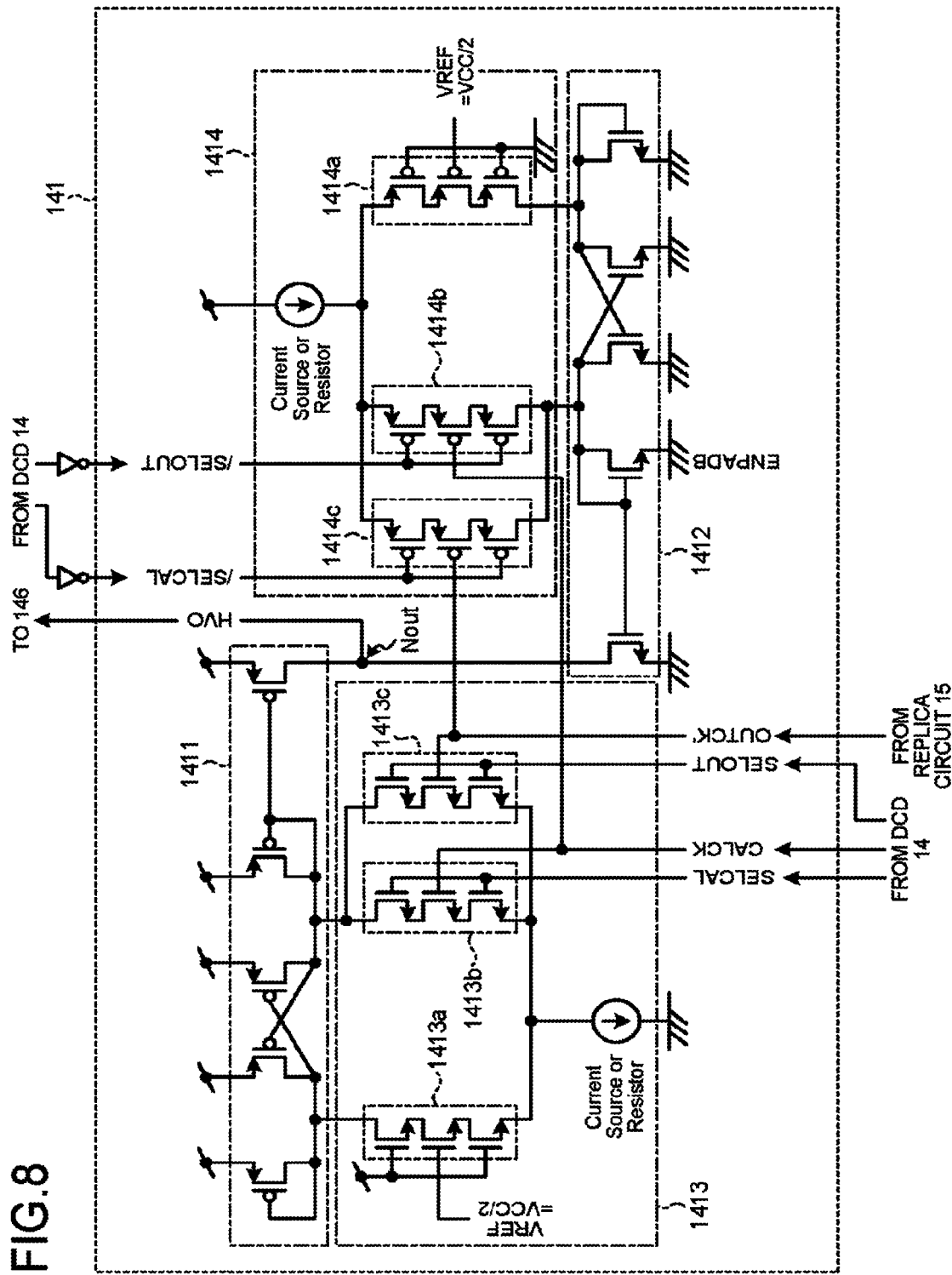
FIG. 8 is a diagram illustrating a configuration of a selector amplifier in an embodiment.

Next, the DCD 14 will be described using FIGS. 7 to 9. FIG. 7 is a diagram illustrating a configuration of the DCD 14. FIG. 8 is a diagram illustrating a configuration of the selector amplifier 141 in the DCD 14.

The DCD 14 includes a selector amplifier 141, a signal generation circuit 146, a timing control circuit 147, a charge/discharge circuit 145, a voltage conversion circuit 142, a voltage conversion circuit 143, a comparator 144, a digital block 150, a frequency-divider circuit 148, and a reset circuit 149.

The voltage conversion circuit 142 converts the duty ratio of the calibration clock φCALCK (or the host clock φHSTCK) into a voltage. The voltage conversion circuit 143 converts the duty ratio of the replica clock φOUTCK' into a voltage. The comparator 144 compares the voltage of the voltage conversion circuit 142 and the voltage of the voltage conversion circuit 143, and outputs a comparison result to the digital block 150. When the voltage of the voltage conversion circuit 142 is higher than the voltage of the voltage conversion circuit 143, the comparator 144 outputs an H-level signal cmpout. When the voltage of the voltage conversion circuit 142 is the voltage of the voltage conversion circuit 143 or less, the comparator 144 outputs an L-level signal cmpout.

When having received the H-level signal cmpout, the digital block 150 increments the control code DCCCODE in each clock timing until receiving the L-level signal cmpout. When having received the L-level signal cmpout, the digital block 150 decrements the control code DCCCODE in each clock timing until receiving the H-level signal cmpout. The digital block 150 supplies the incremented or decremented control code DCCCODE to the DCA 12.

For example, the voltage conversion circuit 142 includes a capacitance element C1. The voltage conversion circuit 143 includes a capacitance element C2. The charge/discharge circuit 145 charges the capacitance element C1 during a period in which the calibration clock ϕCALCK is in the H level, and discharges the capacitance element C1 during a period in which the calibration clock ϕCALCK is in the L level. The charge/discharge circuit 145 charges the capacitance element C2 during a period in which the replica clock ϕOUTCK' is in the H level, and discharges the capacitance element C2 during a period in which the replica clock OUTCK' is in the L level.

For example, the charge/discharge circuit. 145 includes a PMOS transistor 145*a*, an MOOS transistor 145*b*, a current source 145*c*, a current source 145*d*, a switch 145*e*, and a switch 145*f*. The PMOS transistor 145*a* has a source connected to the current source 145*c*, a drain connected to a node N1, a gate connected to the signal generation circuit 146. The NMOS transistor 145*b* has a source connected to the current source 145*d*, a drain connected to the node N1, and a gate connected to the signal generation circuit 146. The current source 145*c* is connected between the PMOS transistor 145*a* and a power supply potential, and supplies a current to the node N1 when the PMOS transistor 145*a* is turned ON. The current source 145*d* is connected between the NMOS transistor 145*b* and a ground potential, and absorbs the current from the node N1 when the NMOS transistor 145*h* is turned ON.

The switch 145*e* has one end connected to the node. N1 and the other end connected to one end of the capacitance element C1. The switch 145*e* is maintained to be in an ON state during a period in which the selection signal SELCAL (or SELHST) is in an active level, and maintains the node N1 to be in a state of being connected with the one end of the capacitance element C1. The switch 145*e* is maintained to be in an OFF state during a period in which the selection signal SELCAL (or SELHST) is in a non-active level, and maintains the node N1 to be in a state of being cut off from the one end of the capacitance element C1.

The switch 145*f* has one end connected to the node N1 and the other end connected to one end of the capacitance element C2. The switch 145*f* is maintained to be in an ON state during a period in which a selection signal SELOUT is in an active level, and maintains the node N1 to be in a state of being connected with the one end of the capacitance element C2. The switch 145*f* is maintained to be in an OFF state during a period in which the selection signal SELOUT is in a non-active level, and maintains the node N1 to be in a state of being cut off from the one end of the capacitance element C2.

The charge/discharge circuit 145 uses the same current sources 145*c* and 145*d* and clock path CP in converting the duty ratios of two clock into voltages. Accordingly, relative variation of a current source or a clock buffer can be caused not to influence a detection error of the duty ratio.

The selector amplifier 141 receives the calibration clock ϕCALCK from the frequency-divider circuit 148, receives the host clock ϕHSTCK from the input terminal CKIN (see FIG. 2), and receives the replica clock ϕOUTCK' from the replica circuit 15. The selector amplifier 141 receives the selection signals SELCAL, SELHST, and SELOUT from the timing control circuit 147. The selector amplifier 141 selects the calibration clock ϕCALCK in the period in which the selection signal SELCAL is in an active level, selects the host clock ϕHSTCK during the period in which the selection signal SELHST is in an active level, and selects the replica clock ϕOUTCK' during the period in which the selection signal SELOUT is in an active level. The selector amplifier 141 supplies a signal HVO according to the selected clock to the signal generation circuit 146.

For example, the selector amplifier 141 includes differential stages 1413 and 1414 and gain stages 1411 and 1412, as illustrated in FIG. 6. In FIG. 6, a configuration related to the host clock ϕHSTCK is omitted for simplification of illustration. In the differential stages 1413 and 1414, a differential current flows, which is of between the transistor groups 1413*a* and 1414*a* to which the reference voltage VREF is supplied, and transistor groups that have been activated according to the election signals SELCAL and SELOUT, of the transistor groups 1413*b*, 1413*c*, 1414*b*, and 1414*c*. In each of the transistor groups 1413*a* to 1413*c*, and 1414*a* to 1414*c*, transistors are connected in series between the gain stages 1411 and 1412, and a current source, to share a source and a drain. The gain stages 1411 and 1412 include a current mirror circuit, and amplify the differential current according to a mirror ratio and cause the differential current to flow to the output node Nout.

Accordingly, when the selection signal SELCAL is in an active level and the selection signal SELOUT is in a non-active level, the calibration clock ϕCALCK is selected and supplied to the signal generation circuit 146. When the selection signal SELCAL is in a non-active level and the selection signal SELOUT to in an active level, the replica clock ϕOUTCK' is selected and supplied to the signal generation circuit 146.

The signal generation circuit 146 illustrated in FIG. 7 receives the signal HVO from the selector amplifier 141, and receives signals SELP and SELN from the tinting control circuit 147. The signal generation circuit 146 includes a NAND gate 146*a* and a NOR gate 146*b*. The NAND gate 146*a* calculates a NAND operation of the signal HVO and the signal SELP, and supplies a signal PGT as a calculation result to the gate of the PMOS transistor 145*a*. The NOR gate 146*b* calculates a NOR operation of the signal HVO and the signal SELN, and supplies a signal NGT as a calculation result to the gate of the NMOS transistor 145*b*.

The reset circuit 149 resets the capacitance elements C1 and C2 when a reset signal RSTANA in an active level is supplied. That is, a charge charged in the one end of the capacitance element C1 and a charge charged in the one end of the capacitance element C2 are discharged to the ground potential, and the one end of the capacitance element C1 and the one end of the capacitance element C2 are potentially equalized.

The frequency-divider circuit 148 frequency-divides the internal clock ϕOSCCK by m (for example, halves) to generate the calibration clock ϕCALCK. The frequency-divider circuit 148 outputs the generated calibration clock ϕCALCK to the receiver 11 and the selector amplifier 141.

The timing control circuit 147 receives the signal HVO from the selector amplifier 141, and receives the internal clock ϕOSCCK from the OSC 13. The timing control circuit 147 generates the selection signals SELCAL, SELHST, and SELOUT, the signals SELF and SELN, a comparator clock CMPCLK, the reset signal RSTANA, based on the signal HVO and the internal clock ϕOSCCK.

Figure 9:
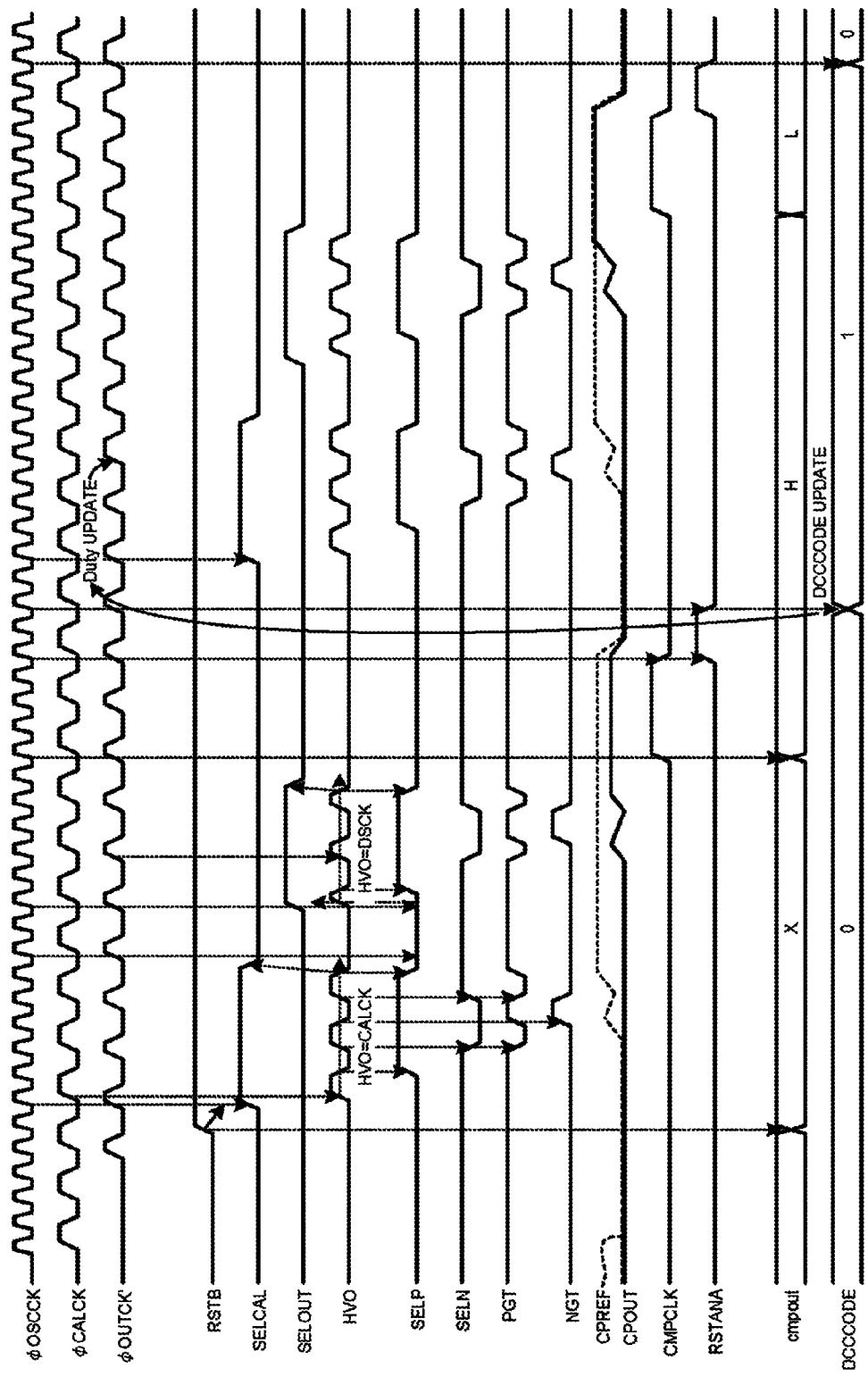
FIG. 9 is a waveform diagram illustrating an operation of a duty cycle detector circuit (DCD) in an embodiment.

For example, as illustrated in FIG. 9, the selection signal SELCAL is generated to rise in synchronization with the internal clock φOSCCK, and to fall at a third fall edge of the signal HVO. FIG. 9 is a diagram illustrating an operation of the DCD 14. The selection signal SELOUT is generated to rise in synchronization with the internal clock φOSCCK after the selection signal SELCAL falls, and to fall at a third fall edge of the signal HVO. Note that the signal HVO can be expressed by (SELCAL and CALCK) or (SELOUT and QUICK). The signal SELP is a signal that serves as a base to generate the signal PGT, and is generated to serve as an H-level signal that covers a time of two pulses, of three pulses of the signal HVO. The signal SELF is a signal that serves as a base to generate the signal NGT, and is generated to serve as an L-level signal that covers an L section of the second and third pulses, of the three pulses of the signal HVO. The signal PGT is a signal of the calculation result of the NAND operation (NAND) of the signal HVO and the signal SELP. The signal NGT is a signal of the calculation result of the NOR operation (NOR) of the signal HVO and the signal SELN.

A voltage CPREF is a voltage of the voltage conversion circuit 142. That is, the voltage CPREF is obtained such that the capacitance element C1 is charged/discharged with the signal PGT (charge) and the signal NGT (discharge) during a period in which the selection signal SELCAL is in the H level, and the voltage level according to a pulse width (≈the duty ratio) of the calibration clock φCALCK is generated.

A CPOUT voltage is a voltage of the voltage conversion circuit 143. That is, the voltage CPOUT is obtained such that the capacitance element C2 is charged/discharged with the signal PGT (charge) and the signal NGT (discharge) during a period in which the selection signal SELOUT is in the H level, and a voltage level according to a pulse width (≈the duty ratio) of the replica clock φOUTCK' is generated.

The comparator clock CMPCLK is a pulse for causing the comparator 144 to perform a comparison operation after charge/discharge of the voltage CPREF and the voltage CPOUT. The comparator clock CMPCLK has a pulse width of two clocks, for example, in consideration of the speed of the comparator 144.

The reset signal RSTANA is a signal for resetting the capacitance elements C1 and C2, for performing comparison of the duty ratios again after the comparison operation of the comparator 144 is terminated.

The comparison result cmpout is a comparison result of the comparator 144. 'x' represents undefined value. 'H' represents that the voltage of the voltage conversion circuit 142 is higher than the voltage of the voltage conversion circuit 143. 'L' represents that the voltage of the voltage conversion circuit 142 is the voltage of the voltage conversion circuit 143 or less.

The control code DCCCODE is n-bit (n is 2 or more) data including a value according to the comparison result cmpout. The control code DCCCODE includes, for example, the value of the tone of the duty ratio to be adjusted in the DCA 12. When the comparison result cmpout is "H", the control code DCCCODE can be decremented correspondingly thereto. FIG. 9 illustrates the decrement of the control code DCCCODE by "1". When the comparison result cmpout becomes "L", the control code DCCCODE stops the decrement corresponding thereto. FIG. 9 illustrates the stop of the decrement of the control code DCCCODE with "0".

Figure 10:
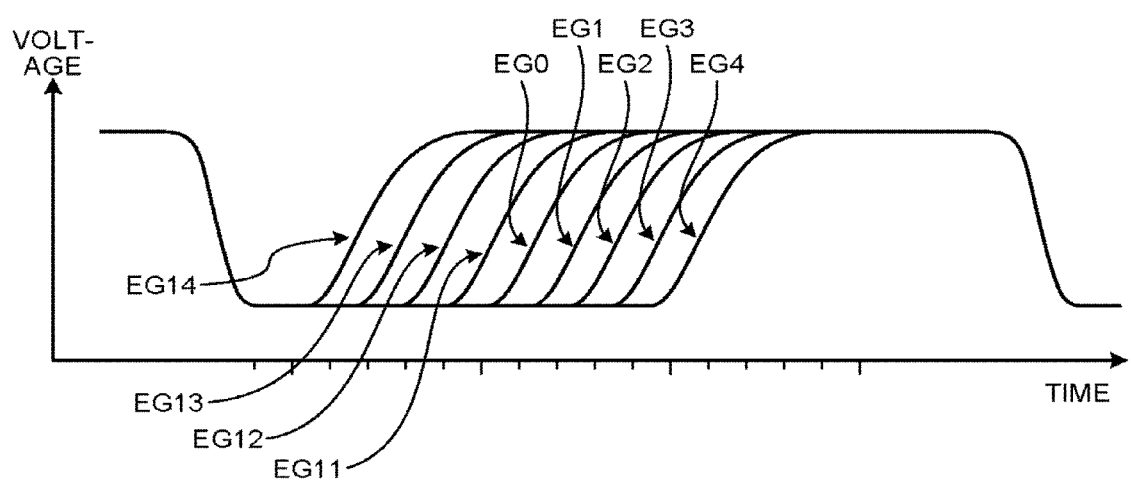
FIG. 10 is a waveform diagram illustrating clocks after duty cycle correction in an embodiment.

The DCA 12 performs correction of the supplied clock (for example, the calibration clock φCALCK) to delay the rising timing of the waveform with the delay amount (correction amount) of the K tone without changing the falling timing of the waveform, according to the control code DCCCODE, as illustrated in FIG. 10. FIG. 10 is a waveform diagram illustrating the corrected clock.

When the comparison result cmpout becomes "L", the control code DCCCODE is incremented. The DCA 12 increments the tone of the correction amount of the duty ratio from the current value (for example, the K/2 tone) for each edge timing of the internal clock φOSCCK, according to the control code DCCCODE. Accordingly, a rising edge of the corrected clock is shifted in a manner of EG0→EG1→EG2→ . . . . Then, when the comparison result cmpout becomes "H", the increment of the control code DCCCODE is stopped. The DCA 12 stops the increment of the tone of the correction amount of the duty ratio according to the control code DCCCODE. Accordingly, the correction amount of the DCA 12 can be adjusted to an amount with which the duty ratio of the replica clock φOUTCK' the duty ratio of the output clock OUTCK) becomes a value close to the reference value (for example, 50%).

Alternatively, when the comparison result cmpout is "H", the control code DCCCODE is decremented. The DCA 12 decrements the tone of the correction amount of the duty ratio the current value (for example, the K/2 tone) for each edge timing of the internal clock φOSCCK, according to the control code DCCCODE. Accordingly, the rising edge of the corrected clock is shifted in a manner of EG0→EG1→EG12→ . . . . Then, when the comparison result cmpout becomes "L", the control code DCCCODE is decremented. The DCA 12 stops the decrement of the tone of the correction amount of the duty ratio, according to the control code DCCCODE. Accordingly, the correction amount of the DCA 12 can be adjusted to an amount with which the duty ratio of the replica clock φOUTCK' the duty ratio of the output clock φOUTCK) becomes the reference value (for example, 50%).

As described above, in the embodiment, the correction amount of the duty ratio is adjusted using the calibration clock φCALCK generated in the host interface 2, and the duty ratio of the host clock HSTCK from the host HA is corrected with the adjusted correction amount to generate the output clock φOUTCK, in the host interface 2. For example, the replica clock φOUTCK' is generated in the replica circuit 15, the replica clock φOUTCK' being a clock corrected by the DCA 12, and a replica clock of the output clock φOUTCK to be output from the output terminal. The duty ratio of the replica clock φOUTCK' deviating from the duty ratio of the calibration clock φCALCK is detected in the DCD 14, and the correction amount is adjusted in the DCA 12 according to the detection result. Accordingly, the correction amount of the duty ratio can be adjusted before the host clock φHSTCK is supplied from the host HA. As a result, it is possible to make the duty ratio of the output clock φOUTCK satisfy the specification from the first clock of the host clock φHSTCK when the semiconductor device 1 is started.

Further, in the embodiment, in the DCD 14, the voltage conversion circuit 142 converts the duty ratio of the calibration clock φCALCK into a voltage, and the voltage conversion circuit 143 converts the duty ratio of the replica clock φOUTCK' in to a voltage. Then, the voltage of the voltage conversion circuit 142 and the voltage of the voltage conversion circuit 143 are compared in the comparator 144, and the duty ratio of the replica clock φφOUTCK' deviating from the duty ratio of the calibration clock φCALCK is detected according to the comparison result. Accordingly, the duty ratio of the replica clock φOUTCK' (≈the duty ratio of the output clock φOUTCK) deviating from the reference can be detected with a simple configuration.

Note that the selection circuit 16 may be provided with a function to select either the signal (host clock ϕHSTCK) received in the input node 11a and the signal (calibration clock ϕCALCK) received in the input node 11b, in a subsequent stage of the receiver 11, as a selector. In this case, the receiver 11 can be realized with a receiver without including a selector.

Figure 11:
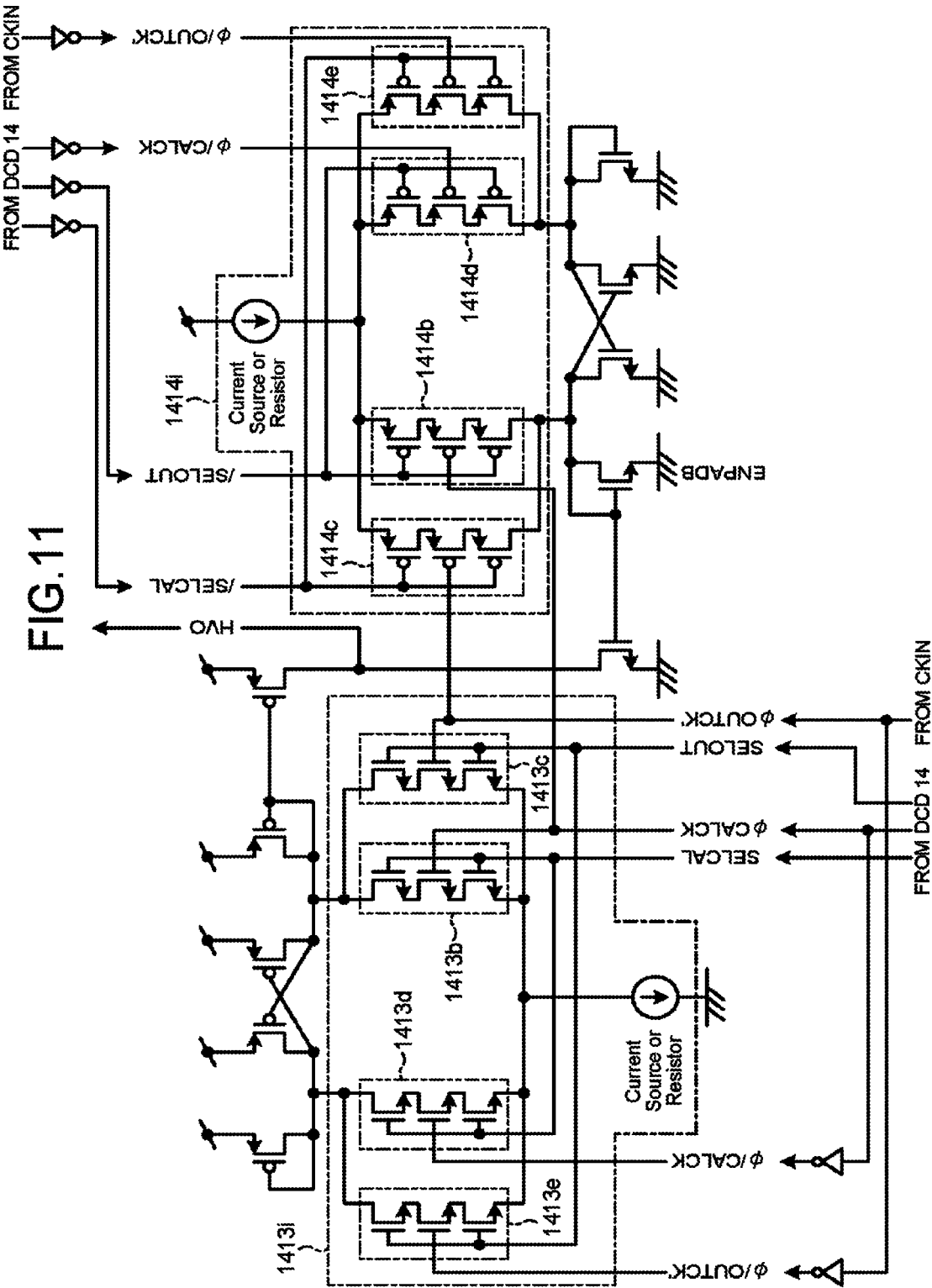
FIG. 11 is a diagram illustrating a configuration of a selector amplifier in a modification of an embodiment.

Alternatively, the selector amplifier 141 in the DCD 14 may be configured with a differential motion. For example, as illustrated in FIG. 11, the selector amplifier 141 may be configured such that mutually inverted clocks are supplied to both sides of a differential stage 1413i and 1414i. For example, inverted clocks t/CALCK supplied to transistor groups 1413d and 1414d are logically inverted calibration clocks ϕCALCK. Inverted clocks ϕOUTCK' supplied to transistor groups 1413e and 1414e are logically inverted replica clocks ϕOUTCK'.

Figure 12:
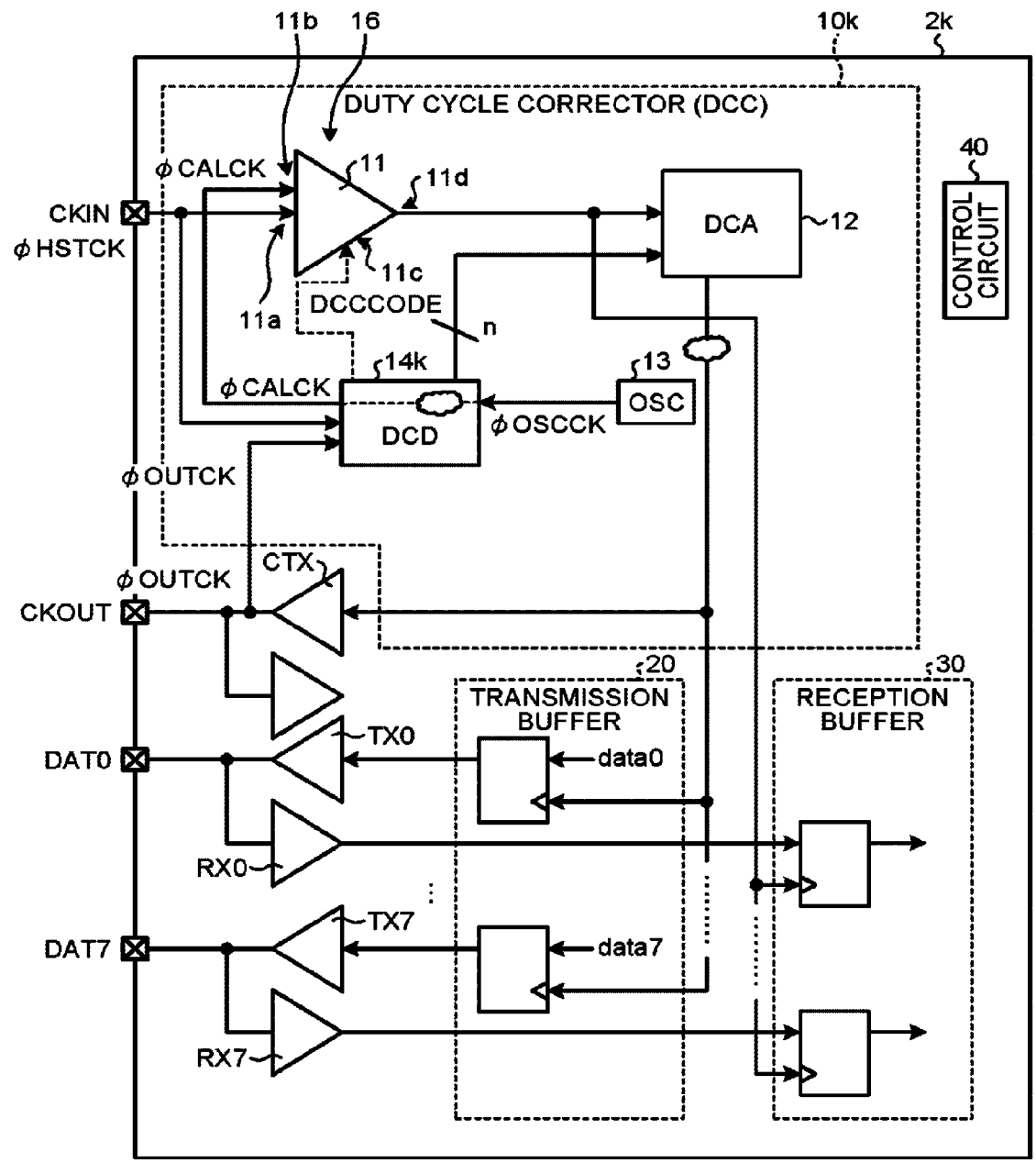
FIG. 12 is a diagram illustrating a configuration of a host interface in another modification of an embodiment.

Alternatively, a host interface 2k may have a configuration in which the replica circuit 15 (see FIG. 2) is omitted in a duty cycle corrector 10k, as illustrated in FIG. 12. In this case, a DCD 14k can receive the output clock ϕOUTCK from the driver circuit CTX instead of the replica clock ϕOUTCK'. In the DCD 14k, the voltage conversion circuit 142 converts the duty ratio of the calibration clock ϕCALCK into a voltage, and the voltage conversion circuit 143 converts the duty ratio of the output clock ϕOUTCK into a voltage. Then, the voltage of the voltage conversion circuit 142 and the voltage of the conversion circuit 143 are compared in the comparator 144, and the duty ratio of the output clock ϕOUTCK deviating from the duty ratio of the calibration clock ϕCALCK is detected according to the comparison result. Accordingly, the duty ratio of the output clock ϕOUTCK deviating from the reference can be more accurately detected.

Figure 13:
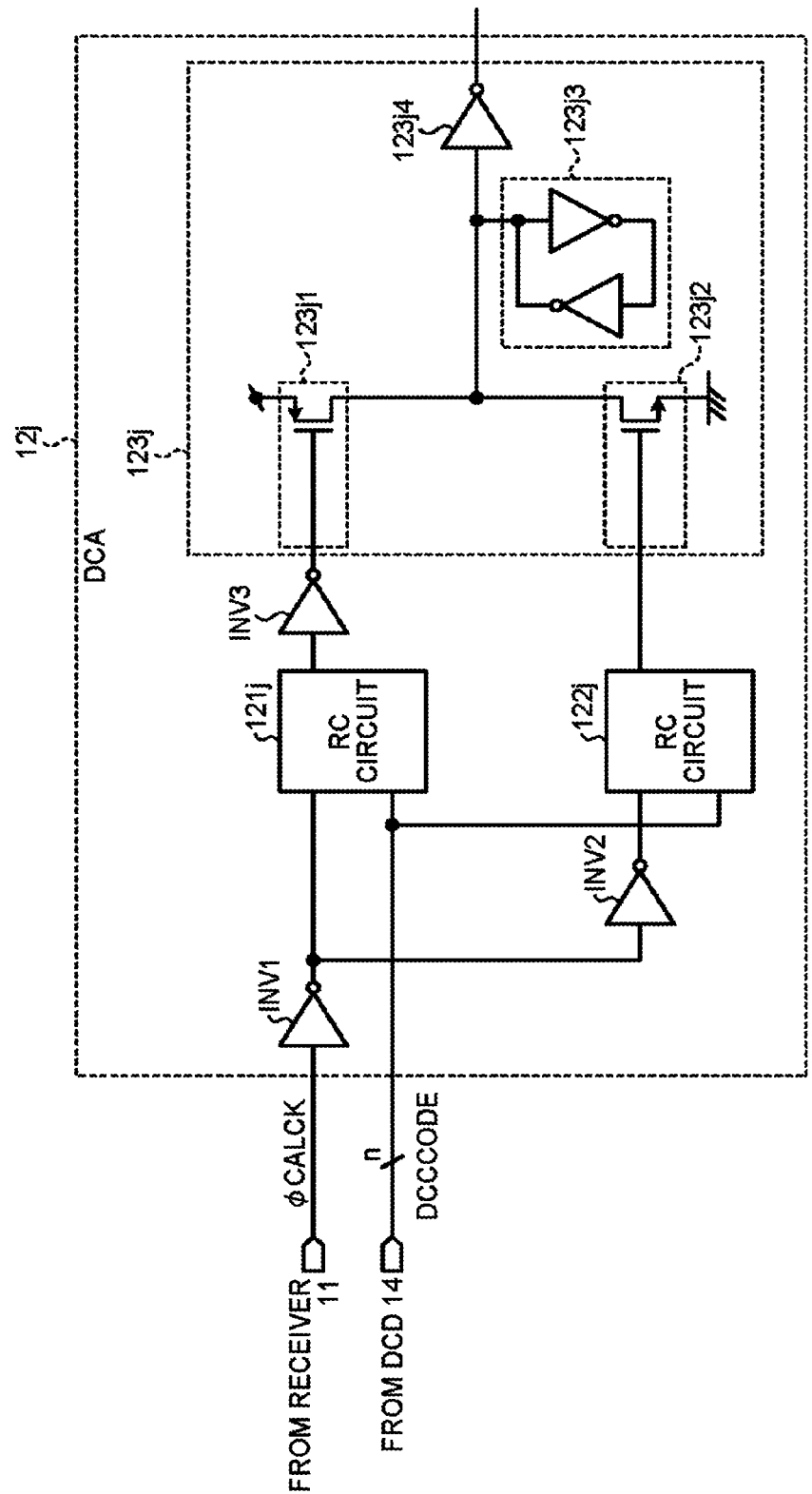
FIG. 13 is a diagram illustrating a configuration of a duty cycle adjuster circuit (DCA) in another modification of an embodiment.

Alternatively, a DCA 12j may be configured to correct the rising edge and the falling edge of the clock, as illustrated in FIG. 13. The DCA 12j includes inverters INV1 to INV3, an RC circuit 121j, an RC circuit 122j, a composite circuit 123j. The composite circuit 123j composites the clock output from the RC circuit 121j and the clock output from the RC circuit 122j, and outputs the composite clock.

The RC circuit 121j receives the clock ϕ/CALCK that is obtained by logically inverting the calibration clock ϕCALCK in the inverter INV1, and delays the falling edge of the clock ϕ/CALCK according to the detection result flag included in the control code DCCCODE. The inverter INV3 logically inverts the clock output from the RC circuit 121j. Accordingly, the RC circuit 121j and the inverter INV3 can equivalently correct the rising edge of the clock ϕ/CALCK. The clock output from the inverter INV3 is supplied to the composite circuit 123j.

The RC circuit 122j receives the calibration clock ϕCALCK through the inverters INV1 and INV2, and delays the falling edge of the calibration clock ϕCALCK according to the detection result flag included in the control code DCCCODE.

Figure 14:
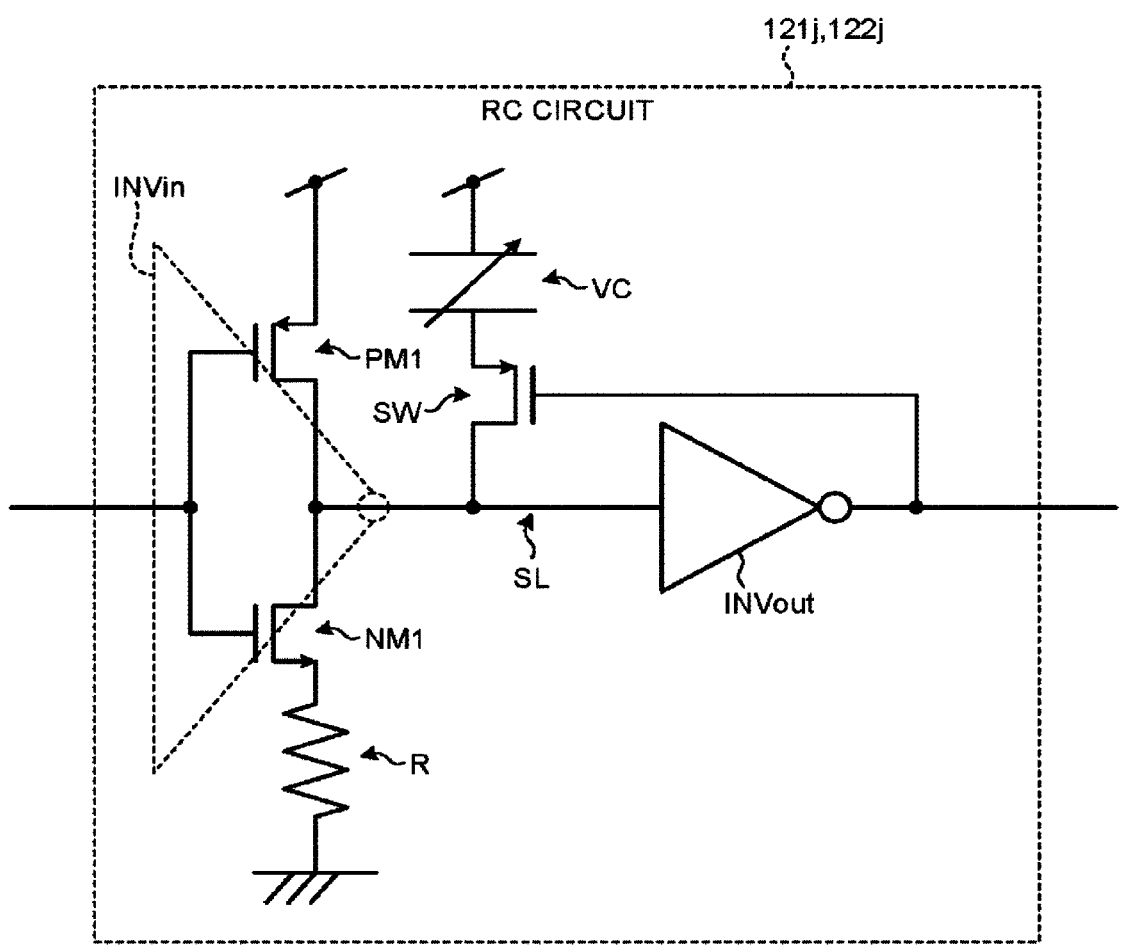
FIG. 14 is a diagram illustrating a configuration of an RC circuit in another modification of an embodiment.

At this time, variation due to process/power supply voltage/temperature (PVT) of the delay of the rising edge of the clock ϕ/CALCK due to the RC circuit 121j and the inverter INV3 and the delay of the falling edge due to the RC circuit 122j may become large. To cope with that, a resistance element R is inserted between an NMOS transistor NM1 in an input inverter INVin and a ground potential in the RC circuits 121j and 122j, as illustrated in FIG. 14, whereby the PVT variation of a delay time of the delay of the falling edge due to the RC circuits 121j and 122j can be reduced.

The RC circuits 121j and 122j includes the input inverter INVin, an output inverter INVout, a variable capacitance element VC, a switch SW, and the resistance element R. The input inverter INVin includes a PMOS transistor PM1 and an NMOS transistor NM1. The switch SW is selectively turned ON at the timing of the falling edge of the clock and connects the variable capacitance element VC to a signal line SL. The signal line SL connects an output terminal of the input inverter INVin and an input terminal of the output inverter INVout. The switch SW includes a transistor having a source connected to the variable capacitance element VC, a drain connected to the signal line SL, and a gate connected to an output terminal of the output inverter INVout.

The composite circuit 123j composites the clock supplied from the RC circuit 121j and the inverter INV3 and the clock supplied from the RC circuit 122j, and outputs the composite clock. The composite circuit 123j includes load circuits 123j1 and 123j2, a latch circuit 123j3, and an output inverter 123j4. The clock received by the load circuit 123j1 from the inverter INV3, and the clock received by the load circuit 123j2 from the RC circuit 122j can have mutually inverted levels. For example, after the load circuit 123j2 is turned OFF according to the falling edge of the clock from the RC circuit 122j, the load circuit 123j1 connects the power supply potential and the latch circuit 123j3, according to the rising edge of the clock from the RC circuit 122j. Accordingly, a waveform of the clock to be latched by the latch circuit 123j3 and to be supplied to the output inverter 123j4 rises with the adjusted correction amount. Further, after the load circuit 123j1 is turned OFF according to the rising edge of the clock from the RC circuit 121j and the inverter INV3, the load circuit 123j2 is turned ON and connects the ground potential and the latch circuit 123j3, according to the clock from the inverter INV3. Accordingly, a waveform of the clock to be latched by the latch circuit 123j3 and to be supplied to the output inverter 123j4 rises with the adjusted correction amount.

The resistance element R is added to each of the RC circuits 121j and 122j in the DCA 12j configured to correct the rising edge and the falling edge of the clock, as described above. Accordingly, variation of a through rate caused by process variation can be suppressed. Further, linearity can be improved by correcting the rising edge and the falling edge of the clock in separate systems.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
an input terminal which receives a first clock;
an output terminal;
an oscillation circuit which generates an internal clock;
an adjuster circuit which corrects a duty ratio of a clock;
a driver circuit which receives the clock from the adjuster circuit and supplies a third clock to the output terminal;
a detector circuit which detects that a duty ratio of a clock according to the third clock deviates from a duty ratio of a second clock according to the internal clock; and a selection circuit connected between the input terminal and the adjuster circuit, wherein the adjuster circuit adjusts a correction amount in tune with the second clock, and corrects a duty ratio of the first clock with the adjusted correction amount according to a detection result of the detector circuit, and the selection circuit includes a first input node connected to the input terminal, a second input node which receives the second clock, and an output node connected to the adjuster circuit.

2. The semiconductor device according to claim 1, wherein
the selection circuit selects either a signal received in the first input node or a signal received in the second input node, and supplies the selected signal to the adjuster circuit.

3. The semiconductor device according to claim 1, wherein
the selection circuit selects either the first clock or the second clock, and supplies the selected clock to the adjuster circuit.

4. The semiconductor device according to claim 1, wherein
the selection circuit further selects the second clock to supply the selected second clock to the adjuster circuit in a first period, and selects the first clock to supply the selected first clock to the adjuster circuit in a second period following the first period, and
the adjuster circuit adjusts the correction amount using the second clock in the first period, and corrects the duty ratio of the first clock with the adjusted correction amount in the second period.

5. The semiconductor device according to claim 4, wherein
the first period includes a period from when the semiconductor device starts up to when the first clock is supplied to the input terminal.

6. The semiconductor device according to claim 1, wherein
the detector circuit receives the clock according to the third clock, and detects that a duty ratio of the third clock deviates from the duty ratio of the second clock.

7. The semiconductor device according to claim 1, further comprising:
a replica circuit which has a characteristic equivalent to the driver circuit, receives the clock from the adjuster circuit, and outputs a fourth clock.

8. The semiconductor device according to claim 7, wherein
the detector circuit receives the fourth clock, and detects that a duty ratio of the fourth clock deviates from the duty ratio of the second clock.

9. The semiconductor device according to claim 8, wherein:
the selection circuit selects the second clock and supplies the second clock to the adjuster circuit in a first period, and selects the first clock and supplies the first clock to the adjuster circuit in a second period following the first period,
the detector circuit detects that the duty ratio of the fourth clock deviates from the duty ratio of the second clock in the first period, and detects that the duty ratio of the fourth clock deviates from the duty ratio of the first clock in the second period, and
the adjuster circuit adjusts a correction amount according to a detection result of the detector circuit in the first period, and corrects the first clock while further adjusting the adjusted correction amount according to the detection result of the detector circuit in the second period.

10. The semiconductor device according to claim 8, wherein
the internal clock has a frequency of m times the first clock, where m is an integer of 2 or more,
the second clock is generated by frequency-dividing the internal clock by m,
the semiconductor device further comprises:
the selection circuit which selects the second clock and supplies the second clock to the adjuster circuit in a first period, and selects the first clock and supplies the first clock to the adjuster circuit in a second period following the first period,
the detector circuit detects that the duty ratio of the fourth clock deviates from the duty ratio of the second clock in the first period and in the second period, and
the adjuster circuit adjusts the correction amount according to a detection result of the detector circuit in the first period, and corrects the first clock while further adjusting the adjusted correction amount according to the detection result of the detector circuit in the second period.

11. The semiconductor device according to claim 1, wherein
the adjuster circuit includes
a first RC circuit which adjusts timing of a rising edge of a clock selected by the selection circuit, and
a second RC circuit which adjusts timing of a falling edge of the selected clock.

12. The semiconductor device according to claim 11, wherein
the second RC circuit includes
an input inverter which includes a PMOS transistor and an NMOS transistor and receives an inverted clock,
an output inverter which outputs a clock according to a signal transmitted from the input inverter through a signal line,
a variable capacitance element connectable to the signal line, and
a resistance element connected to a source of the NMOS transistor.

13. A semiconductor device comprising:
an input terminal which receives a first clock;
an output terminal;
an oscillation circuit which generates an internal clock;
an adjuster circuit which corrects a duty ratio of a clock;
a driver circuit which receives the clock from the adjuster circuit and supplies a third clock to the output terminal; and
a detector circuit which detects that a duty ratio of a clock according to the third clock deviates from a duty ratio of a second clock according to the internal clock,
wherein the adjuster circuit adjusts a correction amount in tune with the second clock, and corrects a duty ratio of the first clock with the adjusted correction amount according to a detection result of the detector circuit,
the internal clock has a frequency of m times the first clock, where m is an integer of 2 or more, and
the second clock is generated by frequency-dividing the internal clock by m.

14. The semiconductor device according to claim 13, wherein the detector circuit receives the clock according to the third clock, and detects that a duty ratio of the third clock deviates from the duty ratio of the second clock.

15. The semiconductor device according to claim 13, further comprising:
a replica circuit which has a characteristic equivalent to the driver circuit, receives the clock from the adjuster circuit, and outputs a fourth clock.

16. The semiconductor device according to claim 13, wherein
the adjuster circuit includes
a first RC circuit which adjusts timing of a rising edge of the first clock, and a second RC circuit which adjusts timing of a falling edge of the first clock.

17. A semiconductor device comprising:
a first voltage conversion circuit which converts a duty ratio of a first clock into a voltage;
a second voltage conversion circuit which converts a duty ratio of a second clock into a voltage; and
a comparator which compares the voltage of the first voltage conversion circuit and the voltage of the second voltage conversion circuit,
wherein deviation of the duty ratio of the first clock from the duty ratio of the second clock is detected according to a comparison result of the comparator,
the first voltage conversion circuit includes a first capacitance element, and
the second voltage conversion circuit includes a second capacitance element, and
the semiconductor device further comprising
a charge/discharge circuit which charges the first capacitance element during a period in which the first clock is in a first level, discharges the first capacitance element during a period in which the first clock is in a second level, charges the second capacitance element during a period in which the second clock is in the first level, and discharges the second capacitance element during a period in which the second clock is in the second level.

18. The semiconductor device according to claim 17, wherein
the charge/discharge circuit includes
a PMOS transistor having a drain connected to a node,
an NMOS transistor having a drain connected to the node,
a first current source connected between the PMOS transistor and a power supply potential,
a second current source connected between the NMOS transistor and a ground potential,
a first switch which allows the node connected to be connected to one end of the first capacitance element, and
a second switch which allows the node to be connected to one end of the second capacitance element.

19. The semiconductor device according to claim 18, further comprising:
a selector which receives the first clock and the second clock, wherein
a signal according to a clock selected in the selector is supplied to gates of the PMOS transistor and the NMOS transistor.

20. The semiconductor device according to claim 19, wherein
the first switch connects the charge/discharge circuit to the first capacitance element when the selector has selected the first clock, and
the second switch connects the charge/discharge circuit to the second capacitance element when the selector has selected the second clock.

* * * * *